United States Patent [19]
Rife et al.

[11] Patent Number: 5,825,622
[45] Date of Patent: Oct. 20, 1998

[54] HEAT SINK ASSEMBLY WITH ADJUSTABLE MOUNTING CLIP

[75] Inventors: William B. Rife, Greenville; Rodney H. Pare, West Warwick, both of R.I.

[73] Assignee: Chip Coolers, Inc., Warwick, R.I.

[21] Appl. No.: 818,361

[22] Filed: May 17, 1997

[51] Int. Cl.$^6$ ............................................. H05K 7/20
[52] U.S. Cl. ..................... 361/704; 361/695; 361/709; 361/710; 361/697; 361/717; 257/718; 257/719; 257/722; 257/727; 165/80.2; 165/80.3
[58] Field of Search ..................... 361/704, 695, 361/710, 717, 697; 257/717.706, 718, 719, 722, 707; 165/80.2, 80.3

[56] References Cited

U.S. PATENT DOCUMENTS

| | | | |
|---|---|---|---|
| Re. 35,573 | 7/1997 | Clemens | 257/719 |
| 2,913,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,313,099 | 5/1994 | Tata et al. | 257/717 |
| 5,397,919 | 3/1995 | Tata et al. | 257/717 |
| 5,708,564 | 1/1998 | Lin | 361/704 |

FOREIGN PATENT DOCUMENTS

| | | |
|---|---|---|
| 0 130 279 | 3/1984 | European Pat. Off. . |
| 29516627 U1 | 1/1996 | Germany . |
| 58-176959(A) | 12/1982 | Japan . |

Primary Examiner—Leo P. Picard
Assistant Examiner—Boris L. Chervinsky
Attorney, Agent, or Firm—Barlow & Josephs, Ltd.

[57] ABSTRACT

A heat sink assembly with an adjustable and customizable mounting clip is provided. The length of the mounting clip can be precisely adjusted to accommodate integrated circuit device sockets of varying lengths. Unused legs of the mounting clip can be completely removed to accommodate neighboring circuit board components. With the mounting clip adjusted and legs selected, a heat sink member is threaded through the top planar member of the mounting clip into flush thermal communication with the top surface of an integrated circuit device to effectuate heat dissipation therefrom.

18 Claims, 5 Drawing Sheets

HEAT SINK ASSEMBLY WITH ADJUSTABLE MOUNTING CLIP

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips are typically installed into a socket which is soldered to a computer circuit board, also known as a motherboard. These integrated circuit devices, particularly the CPU microprocessor chips, generate a great deal of heat during operation which must be removed to prevent adverse effects on operation of the system into which the device is installed. For example, a PENTIUM microprocessor containing millions of transistors is highly susceptible to overheating which could destroy the microprocessor device itself or other components proximal to the microprocessor.

Microprocessor chips, such as the PENTIUM are typically installed in a zero insertion force (ZIF) socket which is soldered directly to the motherboard of a computer. The ZIF socket has become increasingly popular over the years because it can easily accommodate complex integrated circuit chips without fear of damaging the chip itself or the downwardly depending pins which provide the electrical contact from the microprocessor to the motherboard. A ZIF socket includes a release handle which, when open, permits easy installation of the microprocessor into the socket. Subsequent closure of the handle secures the microprocessor in place.

In light of the known heat problems associated with microprocessors, ZIF socket manufacturers have provided protrusions emanating from opposing sides of the ZIF socket to enable heat sink assembly manufacturers to more easily affix their heat sink assemblies to a microprocessor installed in the ZIF socket. It has been well known in the art for heat sink assembly manufacturers to provide mounting clips which span across the ZIF socket to engage with the emanating protrusions to facilitate securing a metal heat sink member into flush thermal communication with the microprocessor. However, these known assemblies, which connect to the ZIF protrusions, cannot be adjusted or customized. The increasing number of ZIF socket manufacturers in response to an exploding demand for computer component parts, results in inconsistent product on the market. The typical length of a ZIF socket varies according to the device to be received. However, the overall length of the ZIF sockets designed for the same device and the resultant distance between opposing ZIF protrusions can vary as much as 5/32 of an inch depending on the manufacturer and mold used for the ZIF socket. In addition, the protrusions emanating from the ZIF socket are not always located in the same position from manufacturer to manufacturer. In addition, universal-type mounting clips for heat sink assemblies are often not adequate because unused portions of the clip, which may be used in a clip from another manufacturer, many obstruct other component parts on the motherboard, particularly in low-profile computer case designs.

In view of the foregoing, there is a demand for a heat sink assembly which can be easily customized to adapt to a wide array of ZIF sockets for a particular microprocessor. It is also desirable for a heat sink assembly to be customizable and adjustable without obstructing or interfering with motherboard design or computer component layout. It is also desirable for such an adjustable heat sink assembly to be easily securable to a ZIF socket without the need for additional tools.

SUMMARY OF THE INVENTION

The present invention preserves the advantages of prior all heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as a PENTIUM processor. The heat sink assembly of the present invention enables the simple, easy and inexpensive assembly, use and maintenance of a heat sink assembly while realizing superior heat dissipation.

The preferred embodiment of the present invention includes two primary members. An adjustable mounting clip and metal heat dissipating member are provided. The heat sink assembly, for removing heat from an electronic device package, is installed on a socket which has protrusions emanating therefrom. A planar top member is provided with a first end and an opposing second end where the top planar member includes a female threaded bore therethrough. The second end of the planar top member defines a male sleeve member. Fixed legs are affixed to and downwardly depend from the first end of the planar top member. Each fixed leg includes a securing aperture at its free end which is capable of engaging with and securing to one of the protrusions emanating from the socket. A female sleeve member is slideably receivable over the male sleeve member and includes sleeve legs depending downwardly therefrom. Each sleeve leg also includes a securing aperture at its free end for engaging and securing to a protrusion emanating from the socket on a side opposite the protrusion engaged with the fixed leg. A heat sink member, with a threaded base portion and a substantially flat bottom surface, is threadably receivable through the female threaded bore through the planar top member into communication with the electronic device package. The distance between the fixed legs and the sleeve legs can be adjusted by movement of the female sleeve to precisely accommodate the socket at hand and its associated protrusions.

In operation, the mounting clip of the present invention is placed over a microprocessor and the socket into which it is installed. The female sleeve is adjusted and a mounting clip is positioned so that the fixed legs and securing apertures engage with a socket protrusion which, on the opposing side, the sleeve legs engage with opposing socket protrusions. Once the overall length of the socket is adjusted, the heat sink member is threaded through the female threaded bore into communication with the microprocessor to secure the entire assembly in place where the downwardly depending legs firmly engage with their respective socket protrusions.

It is therefore an object of the present invention to provide a heat sink assembly which can accommodate integrated circuit sockets of varying lengths.

Another object of the present invention is to provide a heat sink assembly which can be customized to mount to custom selected protrusions emanating from a socket.

It is a further object of the present invention to provide a heat sink assembly which can be easily customized to accommodate various types of motherboard layouts and the position of various components thereon.

It is yet a further object of the present invention to provide a heat sink assembly which is easy to install yet still providing superior heat dissipating results.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
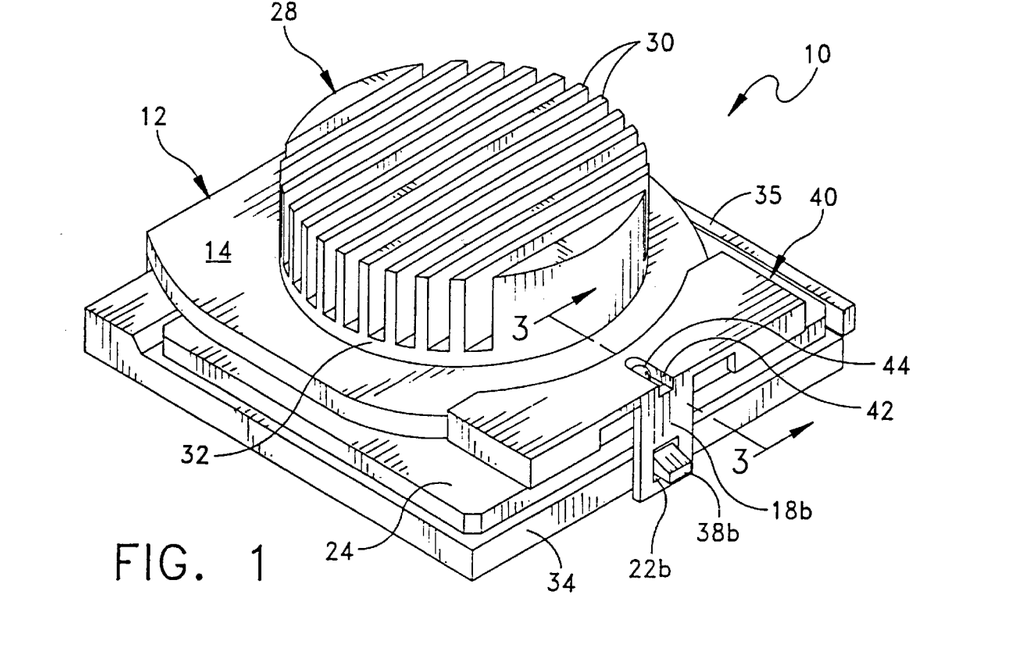
FIG. 1 is a perspective view of the heat sink assembly of the present invention installed on a socket carrying an electronic device package.

Referring to FIG. 1, a perspective view of the heat sink assembly 10 of the present invention is shown installed on an integrated circuit socket 34 carrying integrated circuit chip 24. More specifically, FIG. 1 illustrates the installation of heat sink assembly 10 of the present invention on a zero insertion force (ZIF) socket carrying a microprocessor chip, such as a PENTIUM processor. The drawings are illustrative of use of the heat sink assembly 10 of the present on a ZIF socket carrying a PENTIUM processor; however, the heat sink assembly 10 can be employed for dissipating heat from many different types of integrated circuit chips installed on a wide array of sockets. The use of the present invention on a ZIF socket is an example of the many applications of the heat sink assembly 10 of the present invention. For ease of illustration, the present invention is shown and described in connection with a ZIF socket and PENTIUM processor installed therein.

Figure 2:
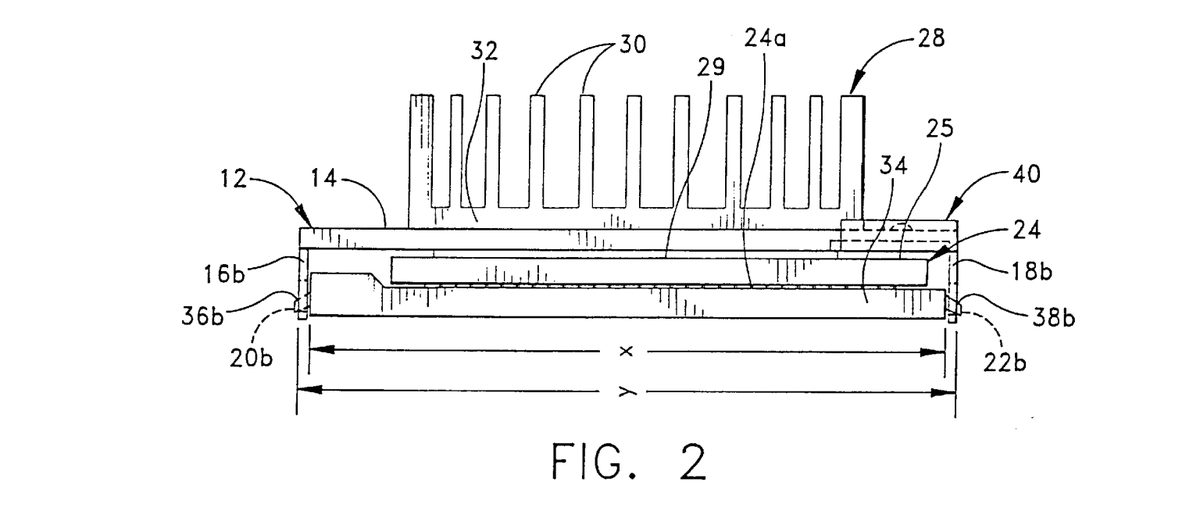
FIG. 2 is a front view of the heat sink assembly of the present invention installed on a socket carrying an electronic device package.

FIG. 1 shows heat sink assembly 10 of the present invention installed on ZIF socket 34 via socket protrusion 38b emanating laterally therefrom. The heat sink assembly 10 includes adjustable mounting clip 12 and a heat sink member 28. Referring to both FIGS. 1 and 2, central fixed leg 16b downwardly depends from planar member 14. As will be discussed in detail below, fixed legs are generally referred to as 16 and can be selectively removed. In FIGS. 1 and 2, central fixed leg 16b remains.

On an opposing side to fixed leg 16b is movable sleeve 40 which slideably engages with planar member 14. Down-wardly depending from sleeve member 40 is central sleeve leg 18b. Similar to fixed legs 16, as will be described in detail below, sleeve legs are generally referred to as 18 and can be selectively removed; however, FIGS. 1 and 2 show only central sleeve leg 18b remaining. Sleeve 40 includes a stop guide channel 42 for slideably containing stop protrusion 44 residing on the top of planar member 14. As a result, sleeve 40 is controllably movable relative to planar member 14.

In addition, heat sink member 28 includes fins 30 and a fin base 32. As in FIGS. 2 and 8, heat sink member 28 is threadably receivable through planar member 14 for bottom surface 29 of heat sink member 28 to become in flush communication with top surface 25 of integrated circuit device 24 installed in socket 34. Male threads 31 threadably engage with female threads 26 about bore 15.

FIG. 2 illustrates the advantages of a mounting clip which is laterally adjustable to accommodate various sized sockets 34. In particular, socket 34 includes a socket length referenced as "x" with protrusions 36b and 38b emanating therefrom. Downwardly depending legs 16b and 18b respectively include securing apertures 20b and 22b for engagement with protrusions 36b and 38b, respectively. Upon engagement of protrusions 36b and 38b, heat sink member 28 is threaded into and through planar member 14 via bore 15 which urges legs 16b and 18b upwards thus causing the bottom wall of apertures 20b and 22b to be snugly secured below protrusions 36b and 38b, respectively. As a result, the entire heat sink assembly 10 is safely secured to ZIF socket 34 with integrated circuit device sandwiched therebetween.

In order for apertures 20b and 22b to respectively engage protrusions 36b and 38b, they must be properly aligned. It is preferred that the mounting clip length be at a distance referenced by "y" in order to ensure a secure connection in accordance with the present invention. Therefore, if socket length "x" is too short or too long, sleeve 40 can be actuated in or out accordingly to precisely adjust the overall mounting clip length to the desired length referenced as "y". Upon the appropriate adjustment of sleeve 40, heat sink member 28 can then be threaded down through planar member 14 to secure the entire assembly in place for heat dissipation.

Figure 3:
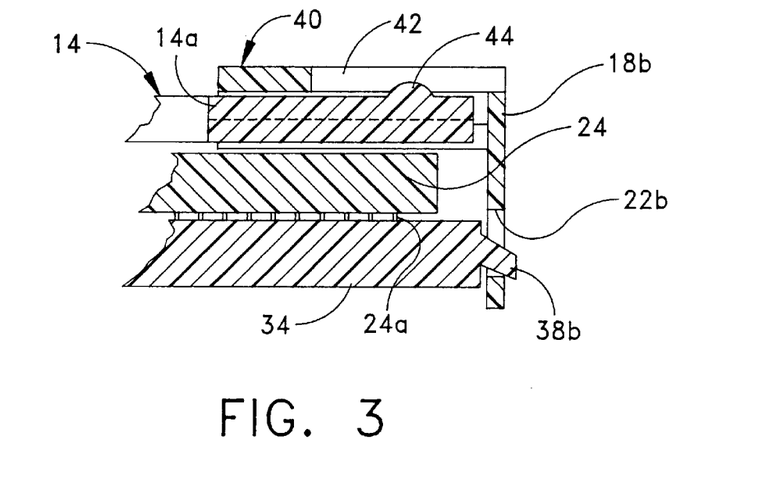
FIG. 3 is a cross-sectional view through the line 3—3 of FIG. 1.

Turning now to FIGS. 3–7, details of the adjustability of mounting clip 12 are shown. FIG. 3 illustrates a cross-sectional view through the line 3—3 of FIG. 1. Socket 34 is provided with integrated circuit device 24 installed therein via pins 24a. Central sleeve leg 18b downwardly depends from sleeve 40. Planar member 14 includes a sleeve engagement member 14a which carries stop protrusion 44 thereon. Stop guide channel 42 is provided through sleeve 40 for containing and guiding the sliding movement of stop protrusion 44 therein. As a result, sleeve 40 is easily movable over sleeve engagement member 14 to adjust the overall mounting clip length to that shown in FIG. 2. The stop protrusion 44 and stop guide channel 42 arrangement permits easy sliding while not permitting sleeve 40 from being easily removed from planar member 14. In assembly, sleeve 40 is threaded over sleeve engagement member 14 and urged over stop protrusion 44 so that stop 44 may enter stop guide channel 42. Slight flexing of sleeve 40 enables this snap-on installation.

Figure 4:
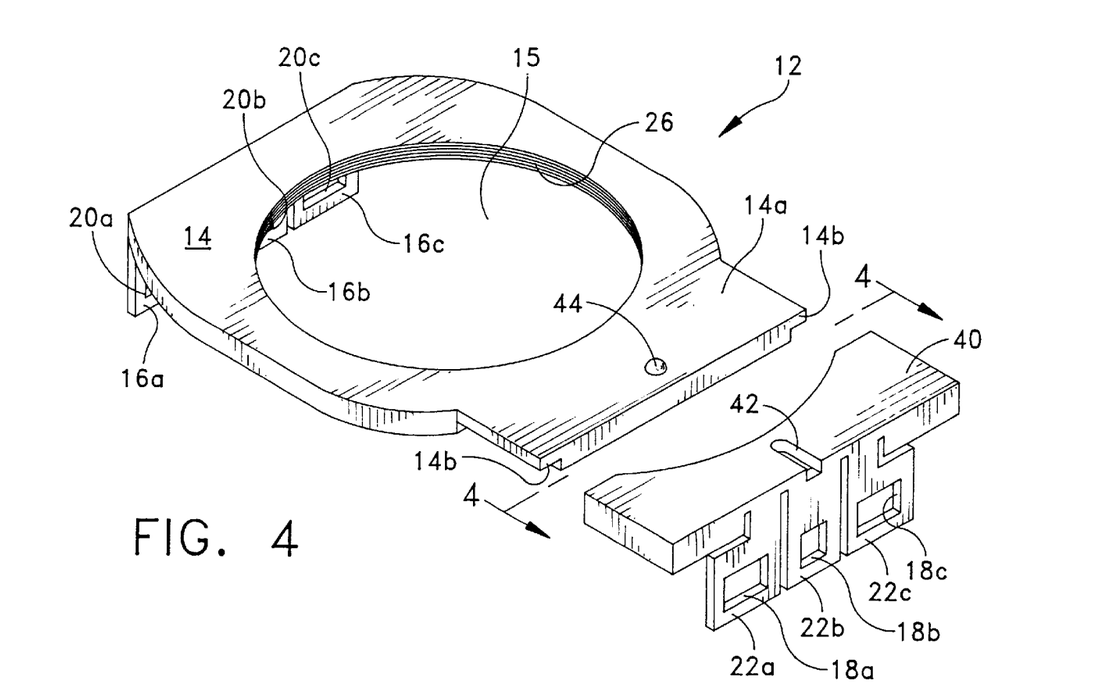
FIG. 4 is a close-up exploded view of the adjustable mounting clip of the present invention.
Figure 5:
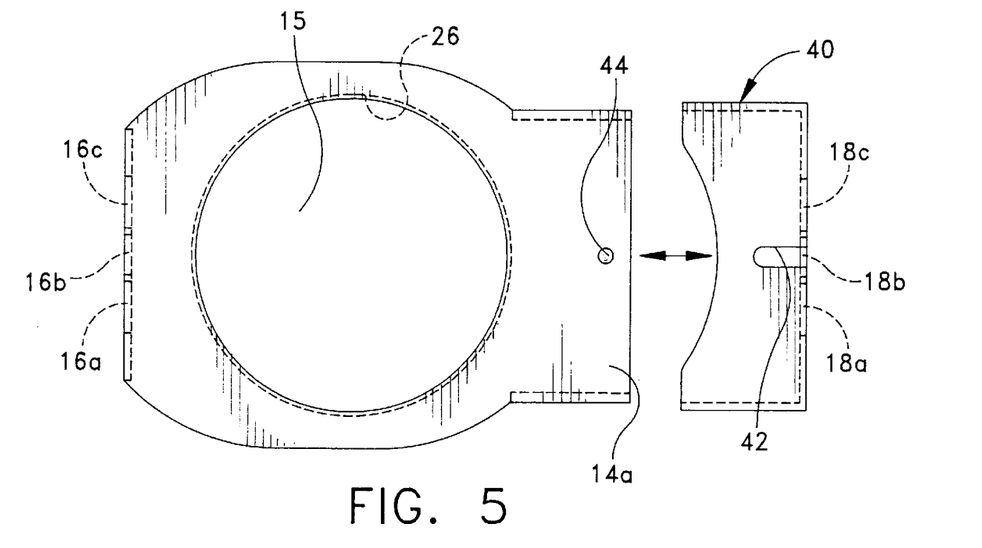
FIG. 5 is a top view of the mounting clip of the present invention shown in FIG. 5.
Figure 6:
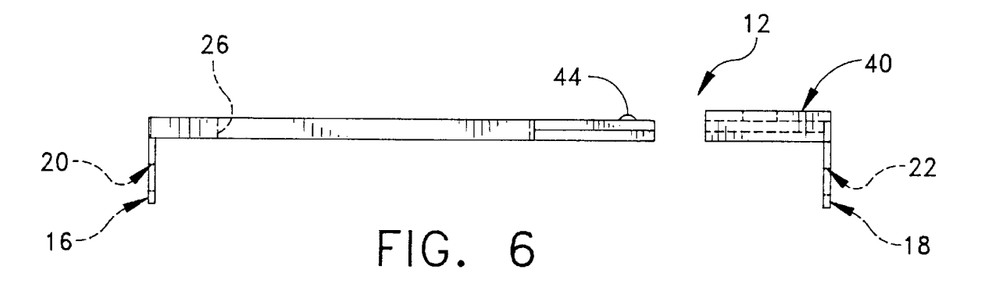
FIG. 6 is a front view of the mounting clip of the present invention shown in FIG. 5.

FIG. 4 further shows additional details concerning the slidable connection between planar member 14 and sleeve 40. Sleeve engagement member 14a of planar member 14 may also include flanges 14 to engage with grooves 46 shown in the right end view of FIG. 7. As a result of flanges 14b and groove 46, sleeve 40 can more easily be aligned on sleeve engagement member 14a of planar member 14. Such flanges 14b are preferred but are not required to carry out the present invention. FIG. 5 further shows the alignment of sleeve 40 on sleeve engagement member 14a to ensure that stop protrusion 44 engages with stop guide channel 42. FIG. 6 shows a front view of the adjustable mounting clip 12 to illustrate the connection of sleeve 40.

The preferred embodiment of the present invention employs stop protrusion 44 and guide channel 42; however, these structural features are not required to carry out the invention. The stop protrusion and guide channel in sleeve 40 may be completely omitted or replaced with a substitute method for preventing complete separation of sleeve 40 from planar member 14, such as a friction fit therebetween.

Figure 7:
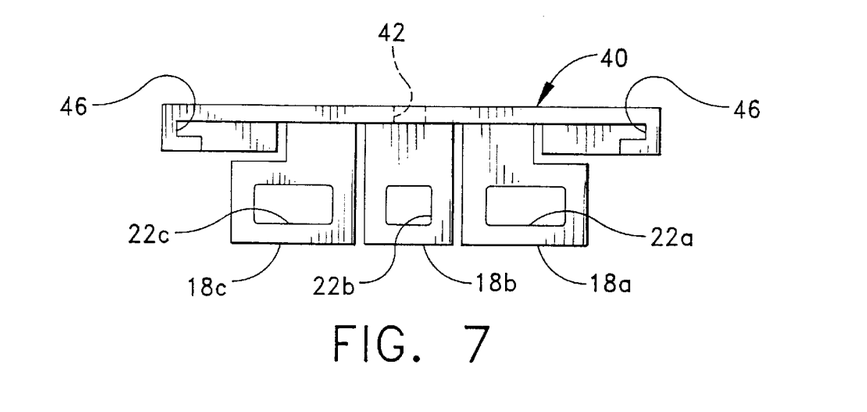
FIG. 7 is a left end view of the sleeve employed in the present invention.
Figure 8:
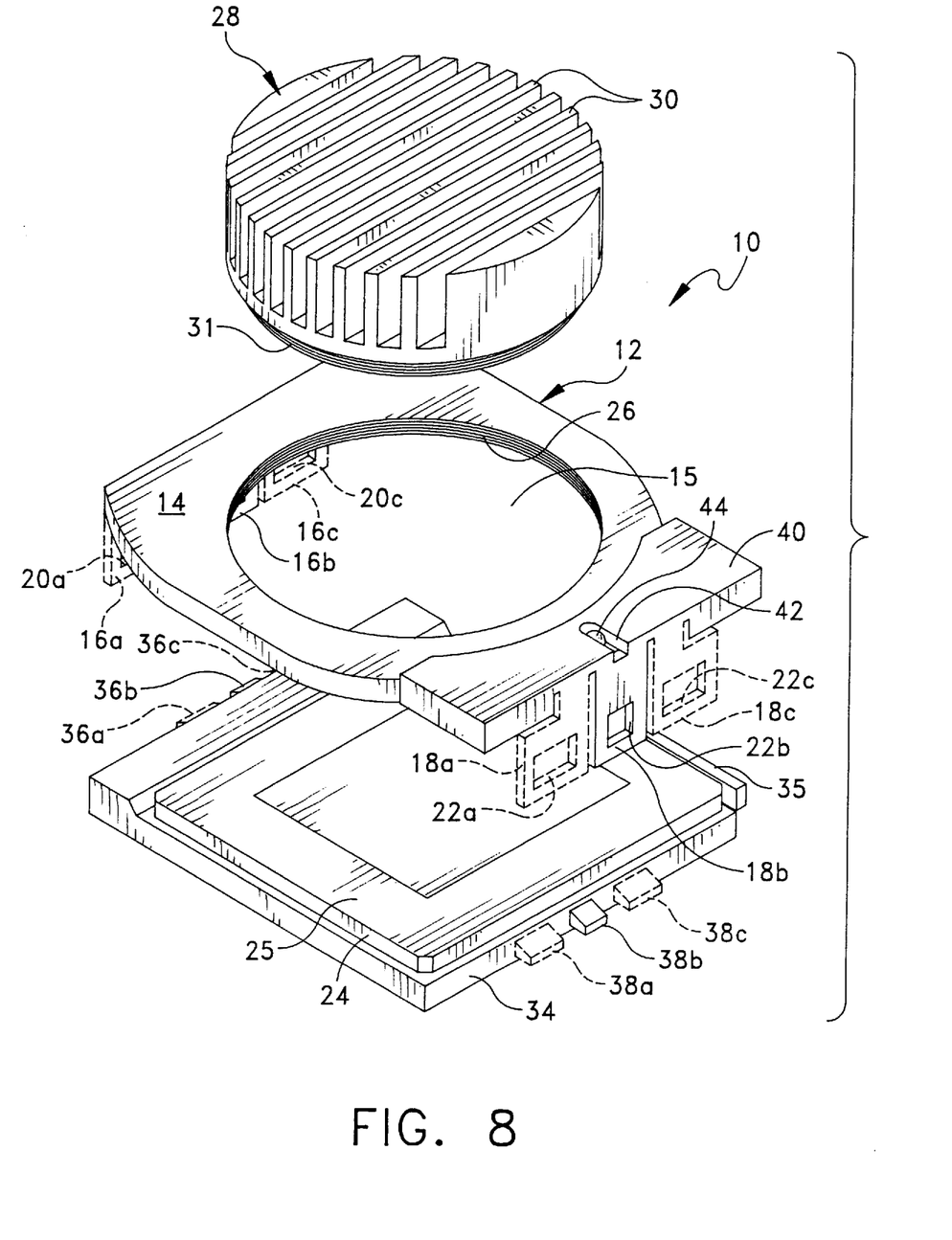
FIG. 8 is an exploded perspective view of the heat sink assembly of the present invention shown in FIG. 1.

In addition to being able to adjust the overall mounting clip length "y" of mounting clip 12, fixed legs, generally referred to as 16 and sleeve legs, generally referred to as 18, can be selectively removed to accommodate the socket 44 and motherboard construction at hand. Referring to FIGS. 4, 7 and 8, adjustable mounting clip 12 is preferably provided with three fixed legs designated as 16a, 16b, and 16c with corresponding securing apertures 20a, 20b, and 20c, respectively. Similarly, it is preferred that three sleeve legs be provided which are generally designated as 18a, 18b, and 18c with corresponding securing apertures 22a, 22b, and 22c, respectively.

ZIF socket 34 is typically provided with protrusions 36a, 36b and 36c on one side thereof as well as protrusion 38a, 38b, and 38c on an opposing side thereof. The heat sink assembly 10 of the present invention includes a mounting clip 12 which can accommodate any combination of protrusions emanating from ZIF socket 34. In FIG. 8, protrusions 36a, 36c, 38a, and 38c are shown in phantom to illustrate that they might not be present on socket 34. In such a case, it would only be necessary to employ central fixed leg 16b and central sleeve leg 18b to affix to protrusions 36b and 38b, respectively. The remaining fixed legs 16a and 16b, and sleeve legs 18a and 18c are not needed and may simply not be used. If socket 34 is fully populated with three protrusions on each side, each of the fixed legs 16 and sleeve legs 18 may be employed.

Figure 9:
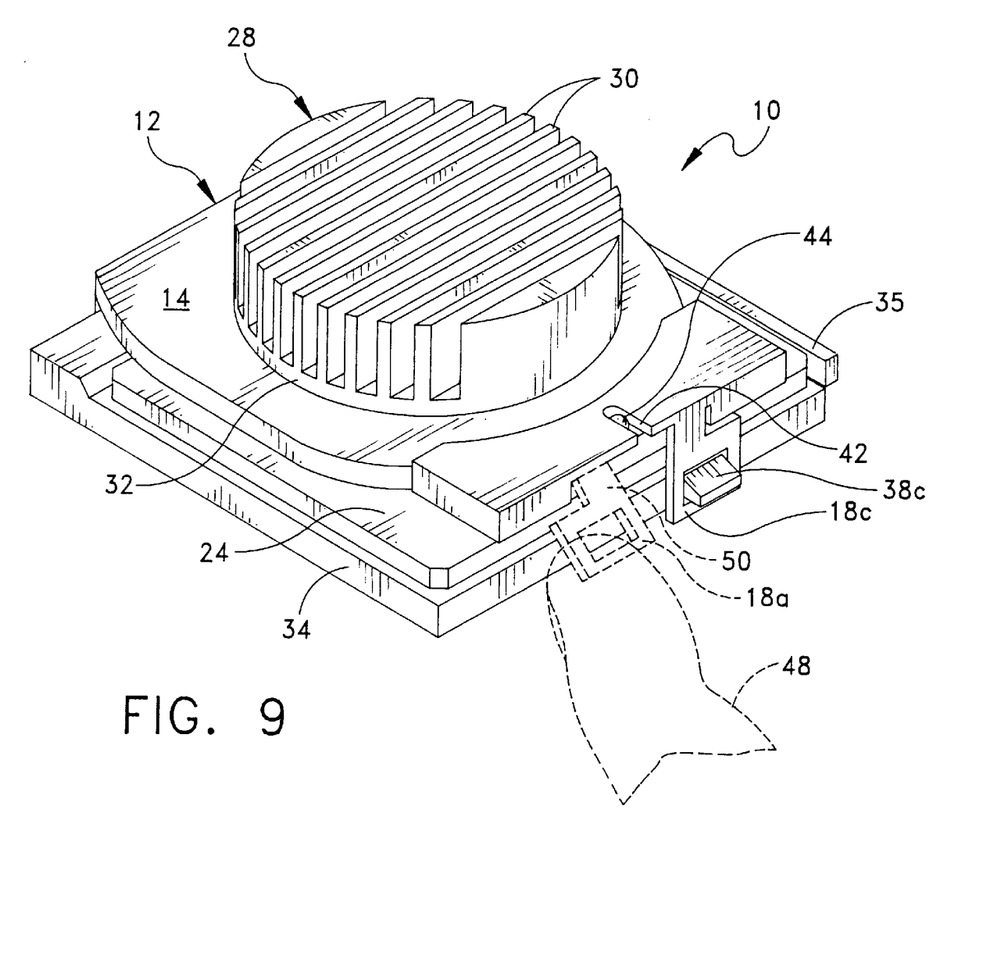
FIG. 9 is a perspective view of the heat sink assembly installed on a socket carrying an electronic device package illustrating removal of an unused sleeve leg.

FIG. 9 illustrates the adaptation of the heat sink assembly 10 of the present invention to a socket 34 which requires connection to socket protrusion 38c. This requirement could be as a result of the lack of protrusions 38a and 38b emanating from socket 34 or a nearby circuit board component being too close to permit employment of sleeve legs 18a and 18b. In such a case, sleeve leg 18a can be completely removed by bending it in an upward fashion with a finger 48, for example. Reduced width neck 50 facilitates sleeve leg 18a being snapped off. If sleeve leg 18c is employed, it is preferred that the cross-corner fixed leg 16a be employed to secure to protrusion 36a to balance out the assembly 10 on socket 34. Similarly, if sleeve leg 18a is employed, opposing fixed leg 16c should be employed. As shown in FIGS. 1 and 2, when sleeve leg 18b is employed, opposing central fixed leg 16b should also be employed. As a result of the foregoing, mounting clip 12 of the present invention can be easily customized to adapt the heat sink assembly of the present invention to any circuit board environment.

It is preferred that the entire mounting clip 12 be manufactured of plastic material, such as a high temperature resistant and high creep resistant plastic for better withstanding the high temperatures associated with microprocessors. For example, the plastic material for mounting clip 12 may be LNP VERTON UF-700-10-HS (P.P.A. 50% long fiber) for use in high temperate heat sink applications. In addition, heat sink member 28 is preferably metal, such as aluminum, for optimum thermal transfer and dissipation of heat from integrated circuit 25. As shown in FIG. 1, upstanding fins 30 are provided but various other heat sink fin configurations may be employed.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from an electronic device package installed in a socket having protrusions emanating therefrom and defining a socket length, comprising:

a planar member with a first end and a second end opposing said first end;

a fixed leg downwardly depending from and connected to said first end of said planar member; fixed leg attachment means connected to a free end of said fixed leg for securing said fixed leg to at least one protrusion emanating from said socket;

a movable leg adjustably connected to said second end of said planar member; movable leg attachment means connected to a free end of said movable leg for securing said movable leg to at least one protrusion emanating from said socket which is not secured to by said fixed leg attachment means;

adjustment means connected to said movable leg for adjustably receiving and connecting to said second end of said top member;

a heat sink member having a flat bottom surface adapted to be received into contact with said electronic device package;

mount means connected to said planar member and said heat sink member for maintaining said heat sink member in thermal heat transfer communication with said electronic device package; and whereby said adjustment means permits said movable leg to be located at varying distances relative to said fixed leg to accommodate sockets of varying lengths while maintaining said heat sink member in communication with said electronic device package.

2. The heat sink assembly of claim 1, wherein said mount means for maintaining said heat sink member in thermal heat transfer communication with said electronic device package includes female threading disposed about a bore through and defined by said planar member and said heat sink member with male threading about its circumference; said heat sink member being threadable through said bore, via engagement with said female threading, to provide said flat bottom surface of said heat sink member into communication with said electronic device package.

3. The heat sink assembly of claim 1, wherein said heat sink member includes a plurality of fin members.

4. The heat sink assembly of claim 1, wherein said fixed leg further comprises a plurality of connection means along its length for selectively engaging with protrusions emanating from said socket; and said movable leg further comprises a plurality of connection means along its length for selectively engaging with protrusions emanating from said socket on a side opposite said fixed leg.

5. The heat sink assembly of claim 4, wherein a connection means connected to said fixed leg and not engaged with a protrusion emanating from said socket is removable from said fixed leg; and a connection means connected to said movable leg and not engaged with a protrusion emanating from said socket is removable from said movable leg.

6. A heat sink assembly for removing heat from an electronic device package installed in a socket having protrusions emanating therefrom and defining a socket length, comprising:

a planar top member with a first end and an opposing second end; said planar top member defining a female threaded bore therethrough; said second end defining a male sleeve member;

a fixed leg affixed to and downwardly depending from said first end of said planar top member; said fixed leg defining a first securing aperture therethrough at a free end of said fixed leg; one of said protrusions being disposed through said first securing aperture thereby removably connecting said fixed leg to said socket;

a female sleeve member defining an open end and a closed end; said male sleeve member slidably receivable into said open end of said female sleeve member;

a sleeve leg affixed to and downwardly depending from said female sleeve member; said sleeve leg defining a second securing aperture therethrough at a free end of said sleeve leg; one of said protrusions not disposed through said first securing aperture being disposed through said second securing aperture thereby removably connecting said sleeve leg to said socket;

a heat sink member having a threaded base portion with a substantially flat bottom surface adapted to be threadably received in said female threaded bore through said planar top member into communication with the electronic device package; and whereby said fixed leg and said sleeve leg defines a distance therebetween which can be selectively adjusted to accommodate said protrusions on a socket having said socket length of varying distances.

7. The heat sink assembly of claim 6, further comprising:

a plurality of fixed legs affixed to and downwardly depending from said first end of said planar top member.

8. The heat sink assembly of claim 6, further comprising:

a plurality of movable legs affixed to and downwardly depending from said female sleeve member.

9. The heat sink assembly of claim 7, wherein each of said plurality of fixed legs are independently removable from said first end of said planar top member.

10. The heat sink assembly of claim 8, wherein each of said plurality of movable legs are independently removable from said female sleeve member.

11. The heat sink assembly of claim 6, further comprising:

stop means for controlling the range of sliding motion of said female sleeve member relative to said male sleeve member.

12. The heat sink assembly of claim 11, wherein said stop means includes a stop protrusion positioned on said male sleeve member of said planar top member; said stop protrusion being slidably engageable within a stop channel positioned and defined by said female sleeve member; sliding travel of said male sleeve member relative to said female member being limited by sliding travel of said stop protrusion within said stop channel.

13. The heat sink assembly of claim 6, wherein said planar top member, said fixed leg, said female sleeve member and said movable leg are made of plastic.

14. A heat sink assembly for removing heat, comprising:

an electronic device socket having a first end, an opposing second end defining a socket length spanning therebetween; a plurality of first protrusions laterally emanating from said first end of said electronic device socket; a plurality of second protrusions laterally emanating from said second end of said electronic device socket;

an electronic device package installed in said electronic device socket; said electronic device package having a top surface;

a planar member having a female threaded bore therethrough; said planar member having a first end and an opposing second end;

a fixed leg downwardly depending from said first end of said planar member;

a sleeve slidably connected to said second end of said planar member; said sleeve having a open end capable of receiving said second end of said planar member and an opposing closed end;

a sleeve leg downwardly depending from said closed end of said sleeve; said fixed leg and said sleeve leg defining a mounting clip length spanning therebetween;

means connected to said fixed leg for securing said fixed leg to one of said plurality of first protrusions laterally emanating from said first end of said electronic device socket;

means connected to said sleeve leg for securing said sleeve leg to one of said plurality of second protrusions laterally emanating from said second end of said electronic device socket;

a heat sink member having a threaded base portion with a substantially flat bottom portion surface adapted to be threadably received in said female threaded bore in said planar member;

whereby said base portion is screwed down through said bore with said flat bottom surface engaging with said top surface of said electronic device package to maintain said heat sink member in flush communication with said electronic device package; said mounting clip length being adjustable, by sliding communication of said sleeve with said second end of said planar member, to provide said means for securing said fixed leg and said means for securing said sleeve leg at a distance from one another to precisely accommodate said socket length of said socket and for said means for securing said fixed leg and said means for securing said sleeve leg to be securely connected to one of said plurality of first protrusions and one of said plurality of second protrusions, respectively.

15. The heat sink assembly of claim 14, further comprising:

a plurality of a fixed legs downwardly depending from said first end of said planar member.

16. The heat sink assembly of claim 14, further comprising:

a plurality of sleeve legs downwardly depending from said closed end of said sleeve.

17. The heat sink assembly of claim 14, further comprising:

a stop protrusion positioned on said planar member proximal to said second end; said stop protrusion being slidable within a stop channel defined by and within said sleeve; sliding travel of said sleeve being limited by sliding travel of said stop protrusion within said stop channel.

18. A heat sink assembly for removing heat from an electronic device package installed in a socket having protrusions emanating therefrom and defining a socket length, comprising:

a mounting clip having a first end, an opposing second end and a mounting clip length;

means for adjusting said mounting clip length;

a first leg downwardly depending from said first end;

a second leg downwardly depending from said second end;

a heat sink member;

means connected to said mounting clip for securing said heat sink member into flush communication with an electronic device package;

means for connecting said first leg to a selected one of said protrusions;

means for connecting said second leg to a selected one of said protrusions not connected to said first leg; and said mounting clip length being adjustable to be substantially the same as said socket length to precisely position said means for connecting said first leg and said means for connecting said second leg for secure connection to selected protrusions, respectively.

* * * * *